United States Patent [19]

Igarashi et al.

[11] 3,848,329

[45] Nov. 19, 1974

[54] METHOD FOR PRODUCING A SEMICONDUCTOR STRAIN SENSITIVE ELEMENT OF AN ELECTROMECHANICAL SEMICONDUCTOR TRANSDUCER

[75] Inventors: Isemi Igarashi; Hiroshi Nakamura; Susumu Sugiyama, all of Nagoya, Japan

[73] Assignee: Kabushiki Kaisha Toyota Chuo Kenkyusho, Aichi-ken, Japan

[22] Filed: Oct. 11, 1973

[21] Appl. No.: 405,534

[30] Foreign Application Priority Data

Oct. 11, 1972 Japan ............................ 47-102238

[52] U.S. Cl. .................................... 29/580, 29/610

[51] Int. Cl. ........................................... B01j 17/00

[58] Field of Search .... 29/580, 583, 25, 35, 610 SG

[56] References Cited

UNITED STATES PATENTS

| | | | |
|---|---|---|---|
| 3,428,933 | 2/1969 | Gerstenberger | 29/610 SG |
| 3,757,414 | 9/1973 | Keller | 29/580 |
| 3,798,754 | 3/1974 | Price | 29/580 |

*Primary Examiner*—Roy Lake
*Assistant Examiner*—W. C. Tupman
*Attorney, Agent, or Firm*—Oblon, Fisher, Spivak, McClelland & Maier

[57] ABSTRACT

A method for producing a semiconductor strain sensitive element of an electromechanical semiconductor transducer, comprising the steps of forming a semiconductor crystal layer integrally and insulately on a base plate, removing predetermined portions of the semiconductor crystal layer, and providing first and second narrow grooves at the predetermined portions, thereby forming at least two elongated strip parts and a plurality of wide parts on the base plate, and forming lead mounting electrodes at predetermined portions of a plurality of the wide parts.

28 Claims, 17 Drawing Figures

METHOD FOR PRODUCING A SEMICONDUCTOR STRAIN SENSITIVE ELEMENT OF AN ELECTROMECHANICAL SEMICONDUCTOR TRANSDUCER

BACKGROUND OF THE INVENTION

1. Field of the Invention

The present invention relates to a method for producing a semiconductor strain sensitive element of an electromechanical semiconductor transducer.

2. Description of the Prior Art

Various semiconductor electromechanical transducers have heretofore been developed and utilized. In conventional versions of such transducers, strain sensitive parts are formed of a semiconductor crystal. Utilizing the piezoresistive effect of such semiconductor crystals, a mechanical force such as load, displacement, acceleration or the like, is applied to the strain sensitive parts and is converted to an electrical signal according to the variation of the resistivity of the semiconductor strain sensitive parts. The electrical signal is typically detected by a bridge circuit.

In such conventional electromechanical semiconductor transducers, a plate, such as the diaphragm of a pressure transducer, or the cantilever of an accelerometer, is formed of metal, ceramic, or the like, and then a strain gauge (referred to as a bulk gauge) consisting of a thin sheet of a semiconductor single crystal is attached on the surface of the plate with organic adhesives to form a strain sensitive part.

Recently, however, the following strain sensitive plate has found wide practical acceptance as a diaphragm or a cantilever of such transducers. Namely, the plate is formed of a base of a thin plate of a semiconductor crystal, and an impurity is diffused into a predetermined portion within a strain sensitive region in the base to form a strain sensitive part (referred to as a diffusion gauge) being of an opposite conductivity type to that of the base. For example, when the base is of an N-type conductivity, the strain sensitive part is of a P-type conductivity, whereby the strain sensitive part is integrally formed with the base and is also electrically insulated from the base.

The resistance variation of the strain sensitive part in the abovedescribed strain sensitive plate employing such a diffusion gauge is introduced outwardly through gold leads or the like. In a typical strain sensitive part (referred to as a strain gauge part) having a belt-shape in which the length is much longer than the width two methods are known for extracting or detecting the resistance variation. In one method, leads are placed in direct ohmic contact with both ends of the strain sensitive part in the longitudinal direction. In the other method, lead mounting electrodes are formed with an aluminum evaporated film at spaced portions from the gauge part on the semiconductor base, and signal transmitting parts are formed on the base between the lead mounting electrodes and both ends of the gauge part in the longitudinal direction by evaporating a conductive metal material such as aluminum or the like into a strip shape thereon so as to connect the electrodes and the gauge part, whereby the electrical signal of the gauge part is transmitted to the electrodes through the signal transmitting parts.

In the former method, leads such as gold wires must be made in direct ohmic contact with the narrow belt-shaped gauge part, but in the latter method, the leads can be easily mounted to the electrodes since the lead mounting electrodes have relatively large areas with respect to the gauge parts. But even in the latter method it is difficult to maintain the electrical characteristics of the connected parts between both ends of the gauge part and the signal transmitting parts in a stable condition, since the gauge part consisting of a semiconductor crystal is directly connected to the signal transmitting part which consists of a metallic material such as aluminum or the like. Therefore, extremely careful techniques are required in this field for performing the latter method.

The assignee of the instant application had developed electromechanical semiconductor transducers which overcome the disadvantages of the aforedescribed conventional transducers in which strain sensitive parts and signal transmitting parts connected thereto are integrally formed with a semiconductor base by means of a semiconductor crystal layer of an opposite conductivity type to that of the base. The lead mounting electrodes made of an aluminum evaporated film or the like are formed on desired portions of the signal transmitting parts on the base, and then leads are attached to the electrodes.

The above-described semiconductor strain sensitive element developed by the assignee may be produced by conventional mask diffusion techniques. The well-known mask diffusion technique typically comprises the steps of forming a semiconductor oxide film on the entire surface of a semiconductor base, providing an opening at a desired portion of said film, and selectively diffusing an impurity into said desired portion through the opening, to thereby form a semiconductor crystal layer having an opposite conductivity type to that of the base, or a semiconductor crystal layer which has the same conductivity type as that of the base and in which the active impurity concentration is much higher than that in the base. This mask diffusion method is characterized in that during the foregoing steps the boundary between the semiconductor base and the diffused layer is protected with the semiconductor oxide film.

The present invention, however, is directed towards a novel and unique method for producing a semiconductor strain sensitive element which does not employ the mask diffusion method as described above.

SUMMARY OF THE INVENTION

It is a primary object of the present invention to provide a practical and useful method for producing a semiconductor strain sensitive element of an electromechanical semiconductor transducer.

Another object of the present invention is to provide a method for producing a semiconductor strain sensitive element of an electromechanical semiconductor transducer which comprises a few simple steps and which provides a strain sensitive element having a high sensitivity.

A further object of the present invention is to provide an improved and novel method for producing a semiconductor strain sensitive element of an electromechanical semiconductor transducer, which element includes strain sensitive means, lead mounting electrodes, and means for transmitting electrical signals of the strain sensitive means to the electrodes by electrically connecting the strain sensitive means and the electrodes.

The foregoing and other objects are attained in accordance with one aspect of the present invention through the provision of a method for producing a semiconductor strain sensitive element of an electromechanical semiconductor transducer which comprises the steps of forming a semiconductor crystal layer integrally and insulately on a base plate, removing predetermined portions of said semiconductor crystal layer, and providing first and second narrow grooves at the predetermined portions, thereby forming at least two elongated strip parts and a plurality of wide parts on the base plate, and forming lead mounting electrodes at predetermined portions of a plurality of the wide parts.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which.

DETAILED DESCRIPTION OF THE PREFERRED EMBODIMENTS

Figure 1:
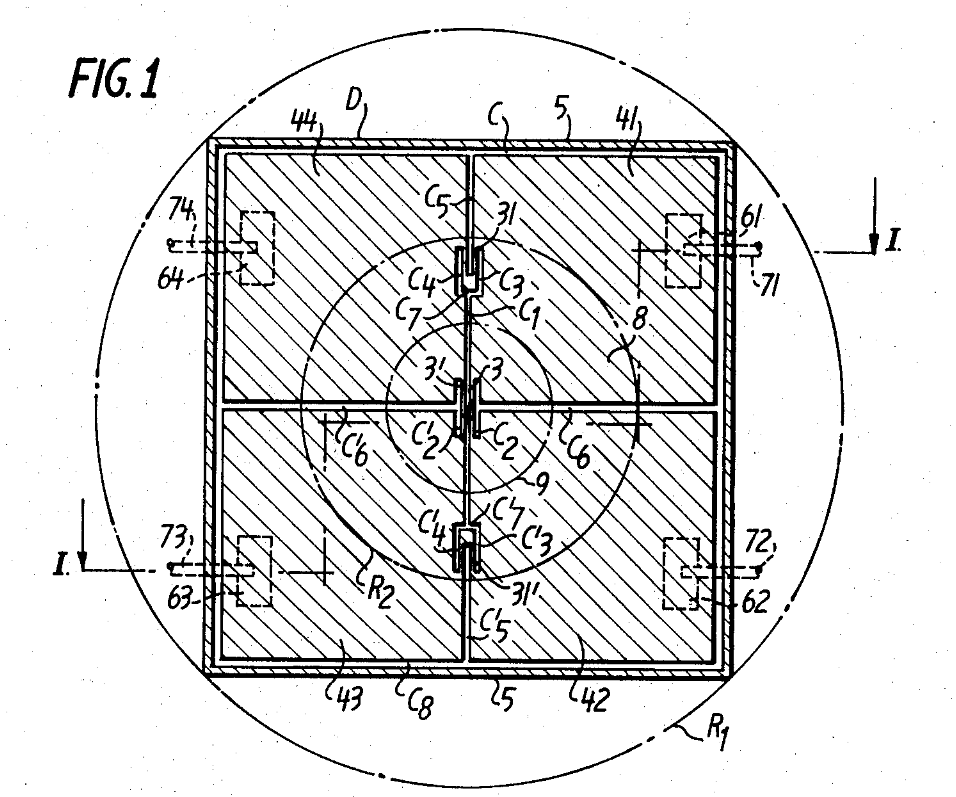
FIG. 1 is a plan view of a semiconductor diaphragm produced according to the teachings of the present invention.

The present invention provides a method for producing a semiconductor strain sensitive element of an electromechanical semiconductor transducer, which element includes strain sensitive parts, lead mounting electrodes, and signal transmitting parts for transmitting electrical signals of the strain sensitive parts to the electrodes by electrically connecting the strain sensitive parts and the electrodes.

In the method according to the present invention, there are three preferred embodiments. One preferred embodiment of the method according to the present invention can be characterized by the following steps:

1. A semiconductor crystal layer is integrally formed with a semiconductor base plate of a predetermined conductivity type on the entire surface of at least one of the faces of the base plate. The semiconductor crystal layer, generally being thinner than the base plate, consists of a semiconductor crystal of the opposite conductivity type than that of the base plate, or may comprise a semiconductor crystal having the same conductivity type as that of the base plate and whose resistivity is less than 0.001 of that of the base plate.

2. At least two elongated strip parts whose length is much longer than their width and a plurality of wide parts whose area is much larger than that of the elongated strip parts are simultaneously and integrally formed on the base plate by removing a semiconductor crystal layer at first predetermined portions within a strain sensitive region and by removing the semiconductor crystal layer at second predetermined portions, thereby providing first narrow grooves in parallel at the first predetermined portions and second narrow grooves at the second predetermined portions at least one end of which each connects to the first narrow grooves.

The depth of the first and second narrow grooves may be equal to or greater than the thickness of the semiconductor crystal layer integrally formed on the base plate.

At least two of elongated strip parts are electrically insulated from each other and from the wide parts (excepting both ends thereof connected to each strain sensitive part) and are employed as the strain sensitive parts in the semiconductor strain sensitive element. The plurality of wide parts are electrically insulated from one another and are employed as signal transmitting parts in the semiconductor strain sensitive element.

The bridge circuit is formed on the base plate by at least two elongated strip parts and the plurality of signal transmitting parts.

3. Layers comprising a metallic material, such as aluminum or the like, are ohmically connected to predetermined portions of a plurality of the signal transmitting parts to thereby form lead mounting electrodes thereon.

The base plate employed in the first step consists of an N-type or P-type semiconductor crystal of silicon, germanium or the like, which are well known in the art as semiconductors. As a semiconductor, a single crystal as well as a polycrystal can be employed.

In the first step described above, a thin layer comprising a semiconductor crystal of an opposite conductivity type to that of the base is integrally formed with the base on the entire surface of one or both of the faces thereof to thereby form an electrically insulating P-N junction at the boundary therebetween. The aforedescribed semiconductor crystal layer can be easily formed by conventional methods, i.e., by uniformly diffusing an impurity into the surface of the base to form a diffused layer by the diffusion method, by uniformly growing a layer consisting of a semiconductor crystal having an opposite conductivity type to that of the base onto the surface of the base by the epitaxial growth method, or by uniformly dispersing an impurity into the surface of the base to form a layer by the ion implantation method. In other words, any suitable method may be employed to obtain the semiconductor member in which a layer is electrically insulated from the base plate by a P-N junction.

As an alternative to the foregoing, however, the following electrical insulating method may be employed. A semiconductor crystal layer which consists of the same conductivity type as that of a base plate and in which the concentration of an active impurity is much higher than that in the base may be formed on the entire surface of one or both faces of the base plate. For example, if the base plate is an N-type semiconductor crystal, the layer to be formed thereon is an $N^+$-type semiconductor crystal. The resistivity of such a layer is predetermined so as to be less than 0.001 of that of the base. Due to the substantial difference in resistivity therebetween, the base can be effectively electrically insulated from the crystal layer. Recently, a semiconductor member which consists of a semiconductor base and a semiconductor crystal layer of an opposite conductivity type to that of the base plate, which layer is formed on the entire surface of one of the faces of the base plate by the epitaxial growth method, has been made commercially available for general purposes. Accordingly, the first step can be omitted by employing such a commercially available semiconductor member.

In the second step, at least two strain sensitive parts are formed at predetermined portions within a strain sensitive region of the semiconductor member obtained by the first step, by removing first predetermined portions of the semiconductor crystal layer and thereby forming the first narrow grooves which are parallel to one another and have a small interval therebetween and whose depth is equal to or greater than the thickness of the semiconductor crystal layer. The strain sensitive region is a region which senses the mechanical displacement based on an external force applied to the transducers when a strain sensitive element is attached to an electromechanical transducer such as a pressure transducer or the like. The resulting strain sensitive parts are elongated strip parts surrounded by the first narrow grooves whose length is much longer than their width.

Concurrently with the formation of at least two strain sensitive parts, a plurality of signal transmitting parts are formed at the semiconductor layer by removing second predetermined portions of the semiconductor crystal layer of the semiconductor member and thereby forming the second narrow grooves which are connected to at least one of the first narrow grooves.

The resulting signal transmitting parts comprise a plurality of wide parts surrounded by the second narrow grooves and whose area is much larger than that of the strain sensitive parts. Therefore, the resistance of the plurality of signal transmitting parts is much smaller than that of the strain sensitive parts. Accordingly, even if the resistance of a portion of the plurality of signal transmitting parts is varied by the strain generated thereto, the resistance variation thereof is very small, almost negligible, when compared with that of the elongated strip strain sensitive parts. Further, the resulting signal transmitting parts are integrally formed with the strain sensitive parts on the base plate but are electrically insulated from one another by means of the first and second narrow grooves excepting the parts thereof connected to each strain sensitive part as described above. Thus, electrical signals of the strain sensitive parts can be accurately transmitted to the electrodes through a plurality of the signal transmitting parts.

As is apparent from the foregoing description, the strain sensitive parts and a plurality of the signal transmitting parts are integrally formed on the base plate with the same semiconductor crystal layer, so the ohmic characteristics of the contact between the strain sensitive parts and a plurality of the signal transmitting parts is much better than that of conventional strain sensitive elements in which layers of aluminum evaporated film with ohmic contacts are connected to the strain sensitive parts (consisting of the semiconductor crystal) to form signal transmitting parts.

The strain sensitive parts and a plurality of the signal transmitting parts can further be formed on the base plate so as to form the bridge circuit thereon.

Thus, the elongated strip strain sensitive parts and a plurality of the signal transmitting parts can be simultaneously and integrally formed on the base plate by the simple step of removing a very small portion of the semiconductor crystal layer, i.e., the first and the second predetermined portions, to thereby provide the first and second narrow grooves which sufficiently reach the upper surface of the base plate. The narrow grooves according to the second step can be easily formed by well-known photo-etching techniques. When straight and narrow grooves are required, a laser machining method or an electron beam machining method may be employed instead of a photo-etching method.

Accordingly, in the second step of the method of the present invention, strain sensitive parts and a plurality of signal transmitting parts can be simultaneously and integrally formed on the base plate so as to form a bridge circuit on the base plate by removing first and second predetermined portions of a semiconductor crystal layer of the semiconductor member obtained by the first step and thereby providing first and second narrow grooves of a predetermined pattern at the first and second predetermined portions of the layer.

Thus, the semiconductor strain sensitive element can be easily and cheaply mass produced. This second step is a most important and significant step and is common to the first to third embodiments of the method according to the present invention, the latter two embodiments to be described hereinafter.

In the third step, lead mounting electrodes are formed on predetermined portions of a plurality of the signal transmitting parts by ohmically connecting layers of a metallic material such as aluminum or the like, to the predetermined portions. Although the layers with ohmic contacts can be connected thereto by various methods, they can be very easily connected by the well-known mask evaporation method. Further, the lead mounting electrodes can be easily formed on the plurality of the signal transmitting parts without a sophisticated technique for deciding the position of the electrodes, since the plurality of signal transmitting parts have large areas compared with those of the strain sensitive parts. It is understood then that the formation of the electrodes can be easily accomplished compared with conventional methods in which the electrodes must be precisely formed on narrow portions at both ends of the elongated strip strain sensitive parts in the longitudinal direction.

Summarily, in the first preferred embodiment of the method according to the present invention, at least two strain sensitive parts and a plurality of signal transmitting parts, which consist of the same semiconductor crystal layer which is electrically insulated from the base plate, are simultaneously and integrally formed on the base plate so as to form a bridge circuit thereon, and then lead mounting electrodes are formed on predetermined portions of the plurality of signal transmitting parts. Thus, a strain sensitive element can be easily produced by very few steps, whereby the method according to the present invention lends itself to high productivity by means of mass production.

Figure 3:
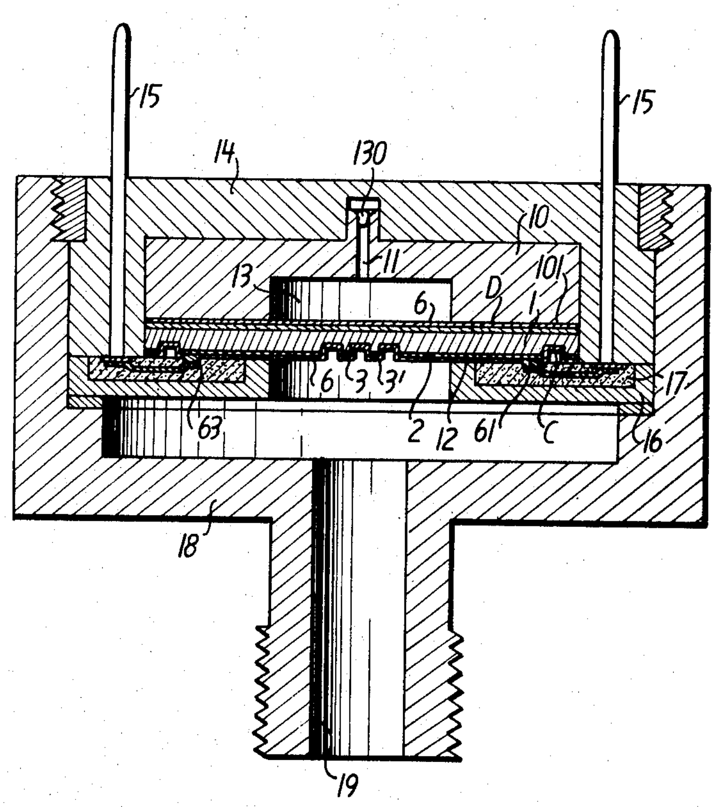
FIG. 3 is a cross-sectional view of a pressure transducer to which a semiconductor diaphragm produced by a preferred embodiment method of the present invention may be attached.

The strain sensitive element produced by the above-described method according to the present invention can be utilized, for example, as a diaphragm of a pressure transducer by affixing the peripheral end portion of the strain sensitive element to the supporting member of such a transducer having an electrical insulating characteristic, and by mounting gold leads or the like to the electrodes of said element. The end product is depicted in FIG. 3, to be described in more detail hereinafter.

A second preferred embodiment of the method according to the present invention will now be described.

The second embodiment of the method according to the present invention includes the first to third steps of the first embodiment and further includes a fourth step of providing an electrical insulating film on the entire surface of the first and second narrow grooves and of the semiconductor crystal layer, except for predetermined portions of the layer used for forming the lead mounting electrodes. The resulting strain sensitive element is covered with an electrical insulating film such as an oxide film or the like, so that the semiconductor element will not be externally exposed. As a result, the portions of the junction (P-N, $N^+$-N or the like) facing the side walls of the narrow grooves will not be exposed and the layer will be more effectively insulated from the base plate. Accordingly, in order to obtain electromechanical semiconductor transducers having more stable electrical characteristics and a greater degree of accuracy, it would be preferable to employ a strain sensitive element produced by the second preferred embodiment of the method according to the present invention, as a diaphragm or cantilever of said transducers. Even if a supporting member of a pressure transducer or the like is made of a metallic material, the strain sensitive element produced by the method of the second embodiment can be attached, as it is, to the supporting member of the transducers, since the surface of the element is electrically insulated by the electrical insulating film. Furthermore, the strain sensitive element produced by the second embodiment can be employed in, for example, an oxidizing atmosphere, because the surface of the element will be protected by the electrical insulating film. Therefore, the secular change of the element is small while having excellent durability when compared with a semiconductor strain sensitive element having an exposed surface. A nitride film, for example, may be formed on the surface of the strain sensitive element as well as an oxide film. Any of a number of suitable methods for forming the electrical insulating film may be employed, as will be evident to a person of ordinary skill in the art.

A third embodiment of the method according to the present invention will now be described.

The third embodiment of the method according to the present invention includes the first to third steps of the first embodiment described hereinabove, and further includes a fourth step of filling the first and second narrow grooves formed by the second step thereof with an electrical insulating filler such as epoxy resin or the like. The resulting semiconductor strain sensitive element will be more reinforced when compared with the semiconductor strain sensitive elements produced by the first and the second embodiments of the method according to the present invention. Therefore, the third embodiment is useful in producing a strain sensitive element for an electromechanical transducer in which a relatively large force is applied across the thickness of the strain sensitive element. Also, since such a filler has electrical insulating characteristics, the insulating relation between the strain sensitive parts and the plurality of signal transmitting parts connected thereto can similarly be maintained, as in the case of aerial insulation by means of grooves. At the same time, the portions of the junction at the narrow grooves will not be exposed by filling the grooves with the electrical insulating filler. Therefore, it is preferable to use the strain sensitive element produced by the third embodiment of the method according to the present invention in transducers in order to realize an electromechanical semiconductor transducer of highly stable electrical characteristics and having increased accuracy.

Referring now to the drawings, wherein like reference numerals designate identical or corresponding parts throughout the several views, and more particularly to FIGS. 1 and 3 thereof, a semiconductor diaphragm and a pressure transducer for measuring the absolute pressure employing said semiconductor diaphragm will be explained as an example of the special pattern of a semiconductor strain sensitive element which is produced by the method according to the present invention and as an example of an electromechanical transducer employing said semiconductor strain sensitive element respectively.

A semiconductor diaphragm designated as D represents a semiconductor diaphragm produced by the method according to the present invention. Diaphragm D has the special pattern having strain sensitive parts and signal transmitting parts divided by means of narrow grooves as shown in FIG. 1, which special pattern has not been heretofore realized in conventional semiconductor diaphragms. As explained above, semiconductor diaphragm D consists of a single crystal or a polycrystal of silicon, germanium or the like, and is formed into a thin plate of nearly square shape and is also provided with lead mounting electrodes.

By way of example, the base plate 1 of semiconductor diaphragm D may comprise an N-type silicon crystal, and the thin layer 2 having a uniform thickness may comprise a P-type silicon crystal. Layer 2 is integrally formed on one of the faces of the base plate 1 in the special pattern as shown in FIG. 1. The base plate 1 is electrically insulated from layer 2 by a P-N junction 12 formed at the boundary therebetween, as seen in FIG. 3.

As another example, the base plate 1 of the semiconductor diaphragm D may consist of N-type silicon crystal, and the thin layer 2 may consist of $N^+$-type silicon crystal, the latter being integrally formed on one of the faces of the base plate in the special pattern as shown in FIG. 1. The base plate 1 is substantially insulated from the layer 2 by the $N$-$N^+$ junction by utilizing the great difference in the resistivity between the N-type silicon crystal and the $N^+$-type silicon crystal (the resistivity of the latter being less than 0.001 of that of the former).

According to the teachings of the present invention, at least one pair of strain sensitive parts 3 and 31 are required. In this embodiment, two pairs of strain sensitive parts 3 and 31, and 3' and 31' are utilized.

The layer 2, consisting of a single crystal formed on the base plate 1, contains strain sensitive parts 3 and 31, and 3' and 31' whose length is much greater than their width, signal transmitting parts having four wide regions 41, 42, 43 and 44 of nearly square shape which contact said strain sensitive parts, and a perimeter part 5, said signal transmitting parts 41 through 44 being provided with electrodes 61, 62, 63 and 64 adjacent the respective corners thereof for mounting leads 71, 72, 73 and 74, respectively.

The strain sensitive parts 3 and 31, and 3' and 31' are all formed within the strain sensitive region 8 of the semiconductor diaphragm D. Region 8 is a region which senses a mechanical displacement based on the external pressure applied to the pressure transducers when diaphragm D is attached to the pressure transducers as shown in FIG. 3. The strain sensitive parts 3 and 31, and 3' and 31' are disposed along a line on the surface of diaphragm D which is perpendicular to one side at nearly the central portion thereof as shown in FIG. 1. The strain sensitive parts 3 and 3' are formed in a belt-shape parallel to each other adjacent the central portion of the perpendicular line described above. On the other hand, the strain sensitive parts 31 and 31' are formed in a U-shape symmetrically with respect to the axis along the periphery of the strain sensitive region 8. When pressure is applied to the surface having the strain sensitive parts 3 and 31, and 3' and 31' of the diaphragm D attached to the pressure transducer (as shown in FIG. 3), a compressive stress is applied to the inner region of the circle 9 (neutral circle of radial stress component) and a tensile stress is applied to the outer region of the circle 9 and within the strain sensitive region 8. Accordingly, in the special pattern shown in FIG. 1, the strain sensitive parts 3 and 3' are disposed in the inner region of the circle 9 and the strain sensitive parts 31 and 31' are disposed in the outer region thereof in order to obtain a high sensitivity and a temperature compensation effect. When the diaphragm D is deformed by the pressure applied to the transducer, the resistance of the strain sensitive parts, based on the piezoresistive effect of the semiconductor, varies greatly corresponding to the stress applied to the strain sensitive parts.

Figure 2:
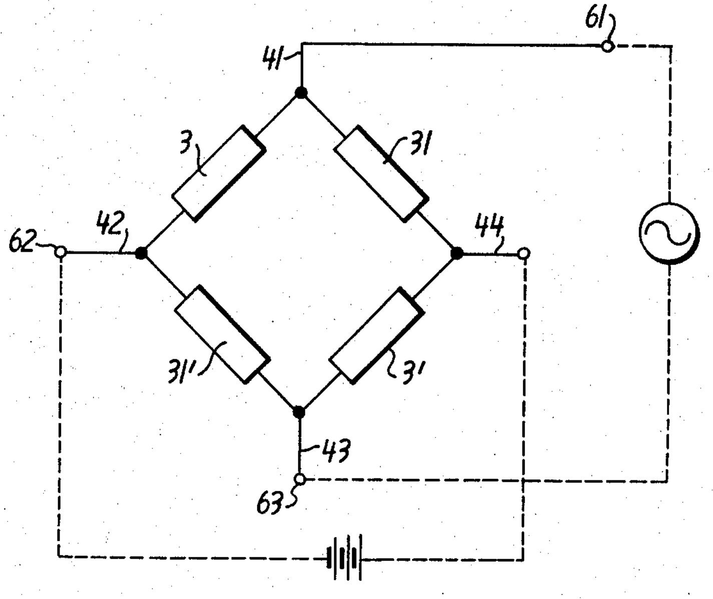
FIG. 2 illustrates an electrical circuit for measuring the pressure applied to the semiconductor diaphragm of FIG. 1 according to the teachings of the present invention.

The signal transmitting parts 41 through 44 are nearly square regions which are formed by dividing the surface layer 2 of diaphragm D into four equal parts by means of narrow grooves. The strain sensitive parts and the signal transmitting parts are integrally formed on the base plate 1. For example, with respect to the special pattern of FIG. 1, the signal transmitting part 41 contacts one end of each of the strain sensitive parts 3 and 31, and the signal transmitting parts 42, 43 and 44 similarly contact one end of each of the strain sensitive parts 3 and 31, 3' and 31', and 3' and 31, respectively. Thus, the strain sensitive parts 3, 31, 3' and 31' and the signal transmitting parts 41 through 44 are integrally formed on the base plate 1 so as to form the bridge circuit as shown in FIG. 2. The signal transmitting parts are electrically insulated from one another by means of the narrow groove C except for the parts thereof connected to each strain sensitive part which parts are electrically connected to each other through each strain sensitive part. Hereinafter, C designates an all-inclusive term for the narrow grooves. The cross section of the narrow grooves C which includes the first and second narrow grooves, is concave and the bottom thereof sufficiently reaches the upper surface of the base plate. In the case shown in FIG. 1, the straight narrow groove C includes said first narrow grooves comprising parallel grooves $C_1$, $C_2$ and $C_2'$ for forming belt-shaped strain sensitive parts 3 and 3', parallel grooves $C_3$, $C_4$ and $C_5$ and groove $C_7$ connecting the parallel grooves $C_3$ and $C_4$ for forming U-shaped strain sensitive part 31, parallel grooves $C_3'$, $C_4'$, $C_5'$ and groove $C_7'$ connecting the parallel grooves $C_3'$ and $C_4'$ for forming U-shaped strain sensitive part 31', and said second narrow grooves for forming the signal transmitting parts comprising the grooves $C_5$ and $C_5'$, grooves $C_6$ and $C_6'$ one end of each of which is connected to the parallel grooves $C_2$ and $C_2'$, respectively, and perimeter groove $C_8$ which is formed along the perimeter of diaphragm D and which is connected to the other ends of grooves $C_6$ and $C_6'$ and also to one end each of grooves $C_5$ and $C_5'$.

As is apparent from the pattern shown in FIG. 1, the width and the area of the signal transmitting parts 41 through 44 are much larger than those of the strain sensitive parts 3, 31, 3' and 31' (in the case shown in FIG. 1, about 200 times larger), and therefore the resistance of the signal transmitting parts is much smaller than that of the strain sensitive parts (approximately 0.05 in the example of FIG. 1). The signal transmitting parts 41 through 44 consist of the same semiconductor crystal layer as that of the strain sensitive parts 3, 31, 3' and 31', and, accordingly, the strain is generated at the part of the signal transmitting parts corresponding to the strain sensitive region and then the resistance variation based on the piezoresistive effect occurs therein when the diaphragm D is deformed by an external force. However, the resistance of the signal transmitting parts 41 through 44 is quite small, as described above, so the influence of the resistance variation based on the piezoresistive effect in the signal transmitting parts 41 through 44 is almost negligible, such that there is no trouble in practical application.

Electrodes 61 through 64, each consisting of a nearly rectangular evaporated film which may be made of a metallic material such as aluminum or the like, are ohmically connected to predetermined portions of the signal transmitting parts 41 through 44, respectively, and when required, leads 71 through 74, which may comprise gold wires or the like, can be further attached to the electrodes 61 through 64, respectively, by ultrasonic bonding or a similar technique.

Although the diaphragm D is provided with a perimeter part 5, as shown in the pattern of FIG. 1, it is of little technical significance and is not essential for the semiconductor diaphragm D. For example, when one wafer (see 21 in FIG. 4) is cut out of a semiconductor single crystal and a plurality of semiconductor diaphragms D are produced from the one wafer, the perimeter part 5 only has an effect on producing techniques in that the boundaries between the mutually adjacent diaphragms can be clearly defined by the perimeter part 5, and also the cutting operation of the respective diaphragms can be easily performed.

Accordingly, the important features of the pattern of the semiconductor diaphragm D shown in FIG. 1 can be summarized as follows: The elongated strip strain sensitive parts 3, 31, 3' and 31' and the signal transmitting parts 41 through 44, which consist of the same semiconductor crystal layer 2, having a uniform thickness, are integrally formed on the base plate 1 by dividing layer 2 by means of straight narrow groove C so as to form a bridge circuit thereon. Strain sensitive parts 3, 31, 3' and 31' are within a strain sensitive region 8, while signal transmitting parts 41 through 44 extend over the strain sensitive region 8 and a non-strain sensitive region. The area of the signal transmitting parts is much larger than that of the strain sensitive parts, so the resistance of the former is much smaller than that of the latter. Further, signal transmitting parts 41 through 44 are provided with lead mounting electrodes 61 through 64, respectively, at predetermined portions thereof.

In FIG. 1, the circle designated $R_1$, which circumscribes diaphragm D, shows the outer peripheral surface of an opening of a supporting member when diaphragm D is attached to the opening of the cylindrical supporting member 10 (seen in FIG. 3) of the transducer and the circle designated $R_2$ shows the inner peripheral surface of the opening of the cylindrical supporting member 10 of the transducer.

Referring now to FIG. 3, an example of the construction of a pressure transducer for measuring the absolute pressure is illustrated which is produced by attaching the semiconductor diaphragm D having the special pattern as shown in FIG. 1 to a supporting member of the transducer. The semiconductor diaphragm D shown in FIG. 3 comprises the semiconductor diaphragm $D_3$ (the surface thereof being covered with an electrical insulating film) produced by the third example of the present invention, which will be explained in more detail hereinafter. In FIG. 3, the numeral 10 designates a cylindrical supporting member for supporting the semiconductor diaphragm D. Cylindrical supporting member 10 is provided with an aperture 11 for letting air escape from a chamber 13 (which will be described later) at the center of the bottom thereof, hole 11 being interconnected to chamber 13. The cylindrical supporting member 10 may be made of metal, ceramics or the like of which the coefficient of thermal expansion is nearly equal to that of the semiconductor diaphragm D. For example, when the semiconductor diaphragm D is a silicon crystal, member 10 may be made of invar (36% nickel-iron alloy). The upper face of semiconductor diaphragm D is attached to the lower end surface 101 of the side wall of the cylindrical supporting member 10 in an electrically insulating condition with adhesives such as epoxy resin or the like to thereby form chamber 13. Chamber 13 is maintained in a vacuum by exhausting air therefrom through hole 11 and by then sealing the upper opening of hole 11 with a sealing material 130. The cylindrical supporting member 10 to which the semiconductor diaphragm D is attached is housed within a cover body 14. Connector pins 15 are disposed in the peripheral wall of cover body 14 and extend therethrough, the lower ends thereof being ohmically connected to the electrodes 61 through 64 through the gold wires 71 through 74, respectively. A protecting ring 16 having an annular groove 17 is attached to the outer peripheral portion of cover body 14 and to the lower surface of diaphragm D with adhesives such as epoxy resin or the like having electrical insulating characteristics to protect the leads annular groove 17 being filled with said adhesives. The entire assembly comprising cylindrical supporting member 10, semiconductor diaphragm D, cover body 14 and protection ring 16, is fitted within a case 18 which has a lower central projection having a long opening 19 for introducing the pressure fluid. The outer pressure fluid to be measured is introduced to the strain sensitive region 8 of the semiconductor diaphragm D on the opposite side of vacuum chamber 13 through opening 19.

The construction of the pressure transducer shown in FIG. 3 for measuring absolute pressure is characterized in that the semiconductor diaphragm D attached thereto has the special pattern as shown in FIG. 1, such that the signal transmitting parts 41 through 44 of the diaphragm D extend to the outer side end of the lower end surface of cylindrical supporting member 10, and therefore the leads can be easily taken out. Further, the pressure transducer having construction described above can be more easily produced when compared with the conventional pressure transducers in which the connector pins are disposed uprightly in the bottom of the supporting member so as to pass therethrough and are connected to gauge parts through lead wires within the vacuum chamber.

Hereafter, details of exemplary production processes of the silicon diaphragm D having the special pattern shown in FIG. 1 produced according to the present invention will be explained by referring to FIGS. 4 through 14, which illustrate the product obtained from each step. For simplicity and ease in understanding the present invention, in the steps following the step (b) (to be described hereinafter) only a piece of the wafer corresponding to one diaphragm will be represented. Also, the thicknesses of thin layer 2 of semiconductor crystal, the oxide film 6 and the like which are formed on the base plate 1 of the diaphragm D are exaggerated, similar to the view seen in FIG. 3. Each of the FIGS. 6 to 14 shows a cross-section taken along the line I—I of the diaphragm D shown in FIG. 1.

When the diaphragm D is actually produced, a plurality of diaphragms connected to one another are simultaneously formed on one wafer (see 21 in FIG. 4), and then either before or after leads are mounted to the electrodes, the wafer is cut into a plurality of diaphragms. However, a plurality of bases for forming the diaphragms may be separated from the wafer after the step (*b*), and then they may be treated by the steps following the step (*b*), to be explained further below.

EXAMPLE 1

This is an example of the first preferred embodiment of the method according to the present invention, which comprises the following steps.

Figure 4:
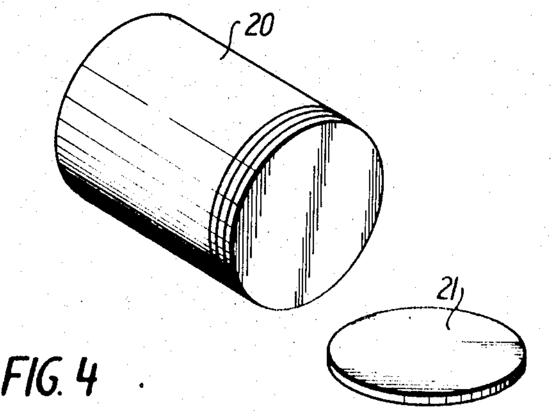
FIGS. 4 through 8 are views helpful in understanding the steps of a first and a second exemplary method according to the present invention.

*a.* As seen in FIG. 4, a block 20 consisting of an N-type silicon single crystal is sliced to obtain a wafer 21 of the (110) crystallographic plane.

Figure 5:
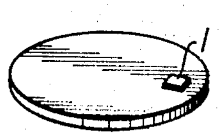

*b.* The surface of the wafer 21 is processed to a mirror finish by lapping and polishing it (the thickness of the processed wafer being about 100 $\mu$), and then the surface thereof is washed with pure water and dried. An N-type silicon based is then cut from the wafer, as seen in FIG. 5.

Figure 6:
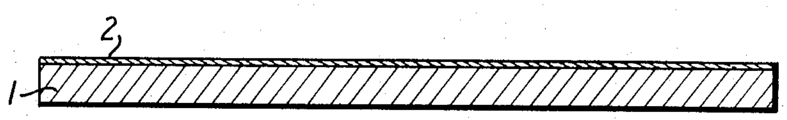

*c*. The N-type silicon base 1 is heated in a mixed gas of hydrogen ($H_2$), silicon tetrachloride ($SiCl_4$) and diborane ($B_2H_6$) at a temperature of about 1200°C for 1 to 10 minutes, to thereby epitaxially grow a thin layer 2 of a uniform thickness (about 1$\mu$) consisting of P-type silicon on the entire surface of one of the faces of the N-type silicon base 1, as seen in FIG. 6.

Figure 7:
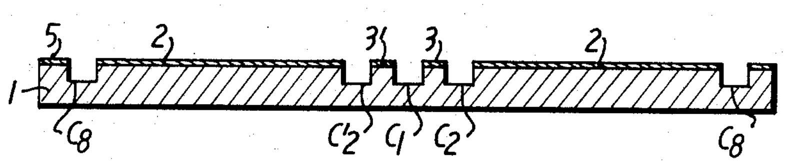

*d*. A photo-resist is coated on the entire surface of the P-type silicon layer 2. Then a predesigned photomask having transparent parts and opaque parts is placed over the photo-resist, the transparent parts corresponding to the strain sensitive parts 3, 31, 3' and 31', the signal transmitting parts 41 through 44, the electrodes 61 through 64 and the perimeter part 5, and the opaque parts corresponding to the straight narrow groove C. The photo-resist is then developed by being exposed to ultraviolet rays from the upper side of the photomask for 10 to 30 seconds. The portion of the photo-resist not polymerized by the ultraviolet rays, i.e. the portion corresponding to the straight narrow groove C, is removed from the P-type silicon layer 2. The P-type silicon layer 2 and a part of the N-type silicon base 1 where the photo-resist is removed are etched to the depth of the desired groove C (about 2$\mu$) with an etching solution comprising mainly nitric acid and hydrofluoric acid ($HNO_3$—HF), potassium hydroxide solution (KOH) or the like, to thereby form the straight narrow groove C being concave in cross section and extending over the surface of the semiconductor layer. Further, the remainder of the photo-resist on the semiconductor layer is removed with a dense sulfuric acid, and then the entire wafer is washed and dried. Thus, as seen in FIG. 7, a P-type silicon layer having the special pattern shown in FIG. 1 is formed on an N-type silicon base, the layer containing the strain sensitive parts 3, 31, 3' and 31', the signal transmitting parts 41 through 44, and the perimeter part 5, which are divided by means of the straight narrow groove C.

In accordance with the above-described step (*d*), four elongated strip strain sensitive parts 3, 31, 3' and 31' whose length is much greater than their width, are formed on the base by removing portions of the P-type silicon layer 2 and a part of the N-type silicon base 1 corresponding to the narrow groove C to thereby form the straight narrow grooves $C_1$, $C_2$, $C_2'$, $C_3$, $C_4$, $C_5$, $C_3'$, $C_4'$ and $C_5'$ which are spaced from one another and whose depth is greater than that of the layer 2, the longitudinal direction of said grooves being parallel to the [110] direction of the P-type silicon layer 2. Concurrently with the formation of grooves $C_1$, $C_2$, $C_2'$, $C_3$, $C_4$, $C_5$, $C_3'$, $C_4'$ and $C_5'$, the straight narrow grooves $C_7$, $C_7'$, $C_6$ and $C_6'$ which are connected to one end each of the grooves $C_1$, $C_3$, $C_4$, $C_1'$, $C_3'$, $C_4'$, $C_2$ and $C_2'$ respectively, are formed in the same manner as described above to thereby form a plurality of wide regions, i.e. the signal transmitting parts 41 through 44, said signal transmitting parts 41 through 44 being electrically insulated from one another by means of grooves $C_7$, $C_7'$ $C_6$ and $C_6'$. The perimeter part 5 is formed by providing a perimeter groove $C_8$ which is connected to one end of each of the grooves $C_5$, $C_5'$, $C_6$ and $C_6'$ in said layer. Thus, the special pattern shown in FIG. 1 is realized on an N-type silicon base 1, in which the strain sensitive parts 3, 31, 3' and 31' whose longitudinal direction is oriented to the [110] direction, and the signal transmitting parts 41 through 44 consisting of the P-type silicon layer 2, are integrally formed on the N-type silicon base 1 so as to form a bridge circuit (such as that seen in FIG. 2) thereon, and also the perimeter part 5 consisting of the same is formed on the base plate

*e*. Aluminum evaporated films are formed on predetermined portions of the signal transmitting parts 41 through 44 consisting of the P-type silicon layer by a vacuum evaporation method which employs a metallic mask, such as stainless steel or the like, with four openings corresponding to the predetermined portions thereof. The diaphragm provided with the evaporated films is then heated in nitrogen gas or a mixture of nitrogen and hydrogen gas at a temperature of 450°C to 440°C for 10 to 20 minutes in order to increase the mechanical strength and to obtain excellent ohmic characteristics at the bonding junctions of the aluminum evaporated films and the P-type silicon layer to thereby form lead mounting electrodes 61 through 64 on the predetermined portions of the signal transmitting parts, as seen in FIG. 8.

Figure 8:
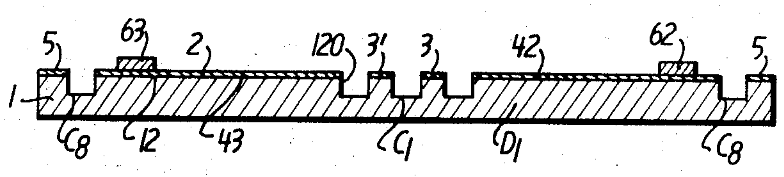

Thus, according to this example of the process of the first embodiment of the present invention, we have provided a silicon diaphragm $D_1$ having the special pattern as shown in FIG. 1 on one surface and in which the final cross section appears as shown in FIG. 8.

The above-enumerated steps (*a*) through (*c*) of this first example correspond to the first step of the first preferred embodiment of the method according to the present invention, as explained more fully hereinabove. In this example, the first step has been divided into steps (*a*) through (*c*) to provide greater detail. The steps (*a*) through (*c*) of this first example can be omitted, as mentioned above, by employing a commercially available semiconductor material which is produced by uniformly growing a thin layer of P-type silicon on the entire surface of one of an N-type silicon wafer by means of the epitaxial growth growth method such as, for example, the silicon epitaxial wafer made by Komatsu Electronic Metals Co., Ltd. of Japan. The steps labeled (*d*) and (*e*) of the first example correspond to the second and third steps, respectively, of the first preferred embodiment of the method according to the present invention, but a person or ordinary skill in the art will realize that the second and third steps can be carried out by methods other than steps (*d*) and (*e*) of this example. Accordingly, the first embodiment of the method according to the present invention should not be limited to this first example.

EXAMPLE 2

The following description represents another example of the first preferred embodiment of the method according to the present invention, which comprises the following steps.

*a*. This step is the same as step (*a*) of the first example, described above with reference to FIG. 4.

*b*. This step is the same as step (*b*) of the first example, described above with reference to FIG. 5.

*c*. A thin layer 2 of uniform thickness (about 1$\mu$) of $N^+$-type silicon is epitaxially grown on the entire surface of one face of an N-type silicon base 1 by heating the N-type silicon base 1 at a temperature of about 1200°C for 1 to 10 minutes in a gas mixture of hydrogen ($H_2$), silicon tetrachloride ($SiCl_4$) and phosphine ($PH_3$). The resistivity of the resulting epitaxial layer 2 formed on the N-type silicon base, seen in FIG. 6, is about 0.0002 of that of base 1.

*d*. This step is the same as step (*d*) of the first example, described above with reference to FIG. 7, except that layer 2 formed on base 1 consists of $N^+$-type silicon and the longitudinal direction of the straight narrow grooves $C_1$, $C_2$, $C_2'$, $C_3$, $C_4$, $C_5$ and $C_3'$, $C_4'$, $C_5'$, to be formed in the $N^+$-type silicon layer 2 is parallel to the [100] direction of the layer 2.

*e*. This step is the same as step (*e*) of the first example described above with reference to FIG. 8.

Thus, according to the second example, a silicon diaphragm $D_2$ is produced which has the same special pattern as that diaphragm shown in FIG. 1 on one face of an N-type silicon base and whose cross section is similar to that of the diaphragm $D_1$ shown in FIG. 8.

There are two distinctions between the diaphragm $D_2$ produced by the second example and diaphragm $D_1$ produced by the first example. Namely, in the diaphragm $D_1$, the thin layer 2 formed on the N-type silicon base 1 consists of P-type silicon, and also the longitudinal direction of the strain sensitive parts and the straight narrow grooves $C_1$, $C_2$, $C_2'$, $C_3$, $C_4$, $C_5$ and $C_3'$, $C_4'$, $C_5'$ is parallel to the [110] direction of the layer. On the other hand, in the diaphragm $D_2$, the thin layer 2 consists of $N^+$-type silicon, and also the longitudinal direction of the strain sensitive parts and the straight narrow grooves is parallel to the [100] direction of the layer. However, the effects of the semiconductor diaphragms $D_1$ and $D_2$ are quite similar to each other in practical use, since both diaphragms $D_1$ and $D_2$ are formed into the special pattern as shown in FIG. 1 in order to utilize the piezoresistive effect of the semiconductor.

EXAMPLE 3

This is an example of the second preferred embodiment of the method according to the present invention, which comprises the following steps.

*a*. This step is the same as step (*a*) of the first example, described above with reference to FIG. 4.

*b*. This step is the same as step (*b*) of the first example, described above with reference to FIG. 5.

Figure 9:
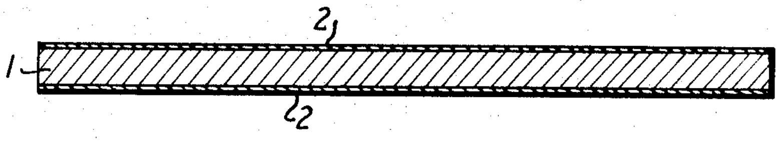
FIGS. 9 through 13 are views helpful in understanding the steps of a third exemplary method according to the present invention.
Figure 10:
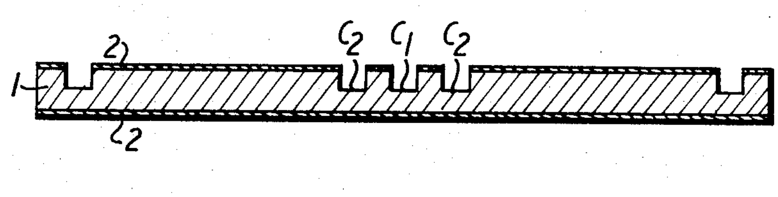

*c*.'' An N-type silicon base 1 is heated at a temperature of 1000°C to 1200°C in a gas mixture of oxygen ($O_2$) gas, nitrogen ($N_2$) gas and diborane ($B_2H_6$) for 20 to 60 minutes to uniformly diffuse boron on the entire surface of both faces of the base 1 to thereby form a thin diffused layer 2 of uniform thickness (about 1$\mu$) of P-type silicon, as seen in FIG. 9.

*d*. This step is the same as step (*d*) of the first example, described above with the end result depicted in FIG. 10.

Figure 11:
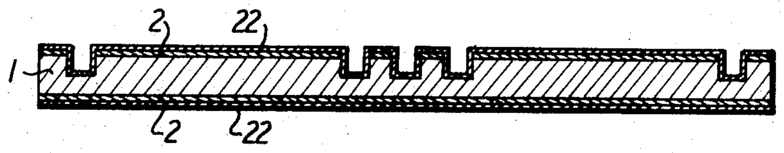

*de*1. The semiconductor diaphragm obtained from step (*d*), which has the special pattern as shown in FIG. 1, is heated at a temperature of about 1000°C for about 30 minutes in a saturated vapor steam or in a mixed atmosphere of steam and oxygen gas to thereby form a silicon oxide film 22 (the thickness thereof being several thousand A) on both surfaces of the layer 2 and the straight narrow groove C, as seen in FIG. 11.

Figure 12:
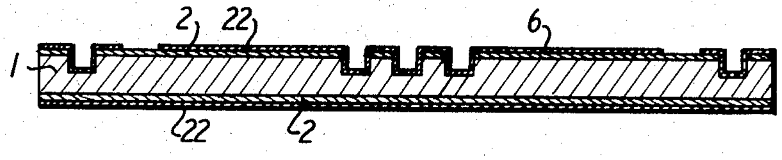

*de*2. Predetermined portions of the silicon oxide film 22 corresponding to the lead mounting electrodes to be formed hereafter is removed by a selective etching method employing a photo-resist, with the result as shown in FIG. 12.

*e*. This step is the same as step (*e*) of the first example, described above with the end result depicted in FIG. 13.

Figure 13:
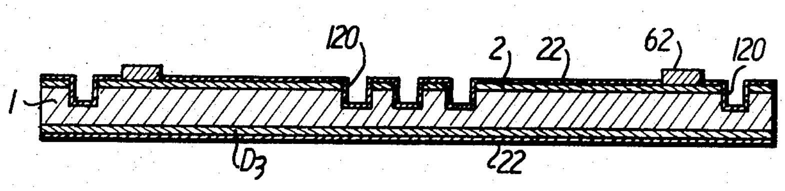

Thus, according to the third example, a diaphragm $D_3$ is produced which has the special pattern as shown in FIG. 1 on one face thereof and whose cross section is as shown in FIG. 13. As is apparent from a comparison of the cross section of diaphragm $D_3$ (of FIG. 13) with that of diaphragm $D_1$ of FIG. 8 produced by the first example, diaphragm $D_3$ has the feature that the entirety of both faces thereof, except for the lead mounting electrodes 61 through 64, is covered with the silicon oxide film 22. Therefore, diaphragm $D_3$ has no exposed parts of silicon crystal which is present in the diaphragm $D_1$ produced by the first example. Accordingly, in diaphragm $D_3$ the electrical insulating characteristics at the P-N junction 12 between the layer 2 and the base 1 can be more precisely maintained compared with the diaphragm $D_1$ produced by the first example which has exposed portions of the P-N junction, since the portions 120 of the P-N junction 12 therebetween, which portions are in contact with the side walls of the narrow groove C, are covered with the silicon oxide film 22. As a result, the pressure transducer to which diaphragm $D_3$ is subsequently attached can be used in an oxidizing atmosphere without any detrimental effects. This feature of the diaphragm $D_3$ is obtained from steps (*de*1) and *de*2) of the third example, which are not included in the first and second examples of the first embodiment of the method according to the present invention. Steps (*de*1) and (*de*2) show an example of the fourth step in the second embodiment of the method according to the present invention of providing an insulating film on the entirety of the surfaces of the narrow grooves and of the semiconductor crystal layer, except for predetermined portions of the layer used for forming lead mounting electrodes. On the other hand, the steps (*c*)'' of this third example does not differ from the step (*c*) of the first example in view of the formation of the P-type silicon layer on the N-type silicon base, so step (*c*)'' of the third example can be substituted by step (*c*) of the first example, and, in the same manner, step (*c*) of the first example can be substituted by step (*c*)'' of the third example.

In step (*c*)'' of this example, the boron diffused layers of P-type silicon are formed on the entirety of both faces of the N-type silicon base 1 only to save the trouble of forming the boron diffused layer on only one of the faces of the N-type silicon base 1. Thus, the formation of the diffused layer on the plane face of the base 1 opposite to the face provided with the narrow groove C does not effect the efficiency of diaphragm $D_3$ produced by the third example.

EXAMPLE 4

The following is one example of the third preferred embodiment of the method according to the present invention, which comprises the following steps.

(*a*) through (*e*) These steps are the same as steps (*a*) through (*e*) of the first example, as described above with reference to FIGS. 4 through 8.

(*f*) An adhesive 23 such as epoxy resin or the like, prepared by being diluted to a suitable viscosity with a solvent beforehand, is provided on the P-type silicon layer of the diaphragm $D_1$ produced by the same steps (*a*) through (*e*) as those of the first example. Then the adhesive 23 is forced into the narrow groove C by spinning the diaphragm $D_1$ at the speed of a few hundred rpm to thereby fill the narrow groove C with the adhesive 23, as seen in FIG. 14.

Figure 14:
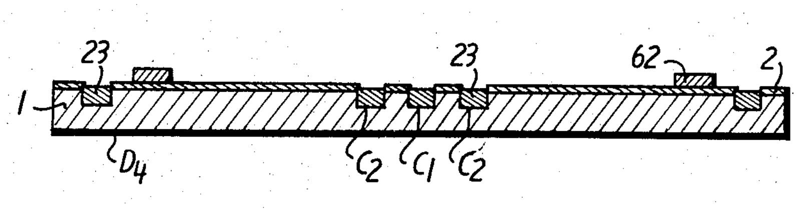
FIG. 14 is a cross-sectional view of a semiconductor diaphragm produced by a fourth exemplary method according to the present invention.

Thus, according to this fourth example, a silicon diaphragm $D_4$ is produced which is formed into the special pattern as shown in FIG. 1 on one face thereof and which has a cross section as shown in FIG. 14. As is apparent from a comparison of the diaphragm $D_4$ and the diaphragm $D_1$ produced by the first example, diaphragm $D_4$ has the feature that the narrow groove C thereof is filled with an adhesive 23 having electrical insulating characteristics. Therefore, diaphragm $D_4$ is reinforced against the applied force in its thickness direction, and is protected with an electrical insulating filler (as in the case of the oxide film of the diaphragm $D_3$ produced by the third example), and also has more stable electrical characteristics than the diaphragm $D_1$ of the first example. This feature of diaphragm $D_4$ is attained by step (*f*) of the fourth example, which is not included in the first and the second embodiment of the method according to the present invention. Step (*f*) represents an example of the fourth step in the third preferred embodiment of the method according to the present invention of filling up the narrow groove C formed by the second step with an electrical insulating filler such as an epoxy resin or the like.

In all of the examples described hereinbefore, N-type silicon was used as the base of the diaphragm consisting of a semiconductor crystal, and a layer consisting of P-type silicon or of $N^+$-type silicon was formed on the N-type silicon base by the epitaxial growth method or the boron diffusion method. One of ordinary skill will realize, however, that the three embodiments of the method according to the present invention are not limited to the above examples. For example, the base of the diaphragm may comprise P-type silicon. Also, the layer to be formed on the base may comprise N-type silicon or $P^+$-type silicon. Further, germanium, gallium arsenide or the like, which have been used in conventional strain sensitive elements, may be used as the semiconductor base, in addition to silicon. Also, with respect to the semiconductor crystal layer to be formed on the base, any suitable semiconductor can be used as long as the layer is integrally formed with the base and is substantially electrically insulated from the base. With respect to the method for forming the semiconductor layer having a different conductivity type from that of the base, an ion implantation method or the like may be employed in addition to the epitaxial growth method and the diffusion method. The straight narrow groove C may be formed by employing a laser beam or an electron beam in addition to the photo-etching method employed in all examples described above. Additionally, with respect to the formation of the electrical insulating film, a silicon oxide film ($SiO_2$) was formed by a thermal oxidation method in the third example, but instead, a silicon oxide film ($SiO_2$ or SiO) may be formed by a vacuum evaporation method, as is well-known.

Figure 15:
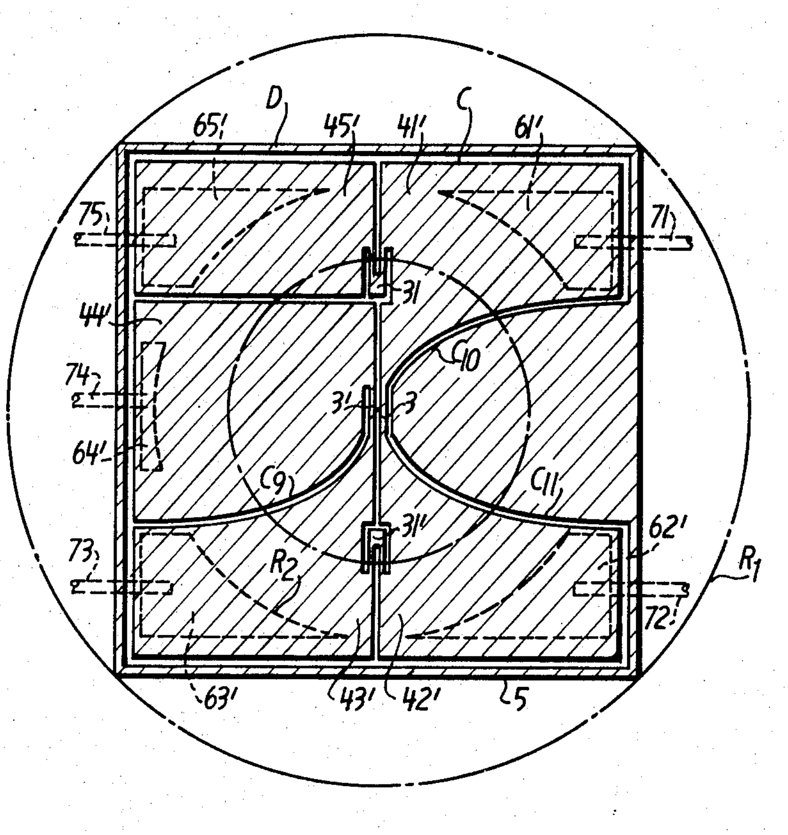
FIG. 15 is a plan view of another semiconductor diaphragm produced according to the teachings of the present invention.
Figure 16:
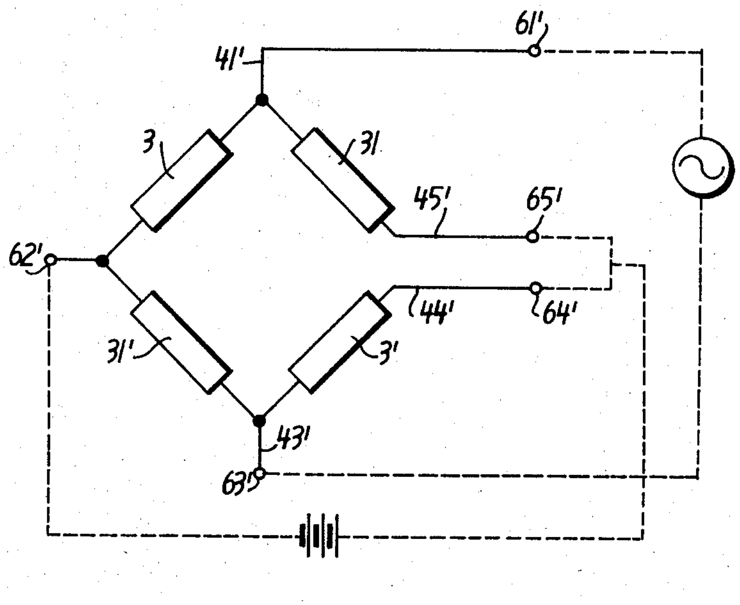
FIG. 16 illustrates an electrical circuit for measuring the pressure applied to the semiconductor diaphragm having the pattern shown in FIG. 15.

Each of the examples of the present invention described above shows a method for producing the semiconductor silicon diaphragm having the special pattern including the straight narrow grooves shown in FIG. 1. However, the present invention is not limited to only a method for producing a semiconductor silicon diaphragm having straight narrow grooves. For example, a semiconductor diaphragm having the curved grooves $C_9$, $C_{10}$, and $C_{11}$ shown in FIG. 15, or other various patterns, can be produced by the method according to the present invention. The semiconductor diaphragm shown in FIG. 15 has strain sensitive parts 3, 31, 3' and 31', five signal transmitting parts 41' through 45', and five lead mounting electrodes 61' through 65', so as to form a bridge circuit as shown in FIG. 16, said electrodes 61' through 65' being provided with five leads 71 through 75, respectively.

Figure 17:
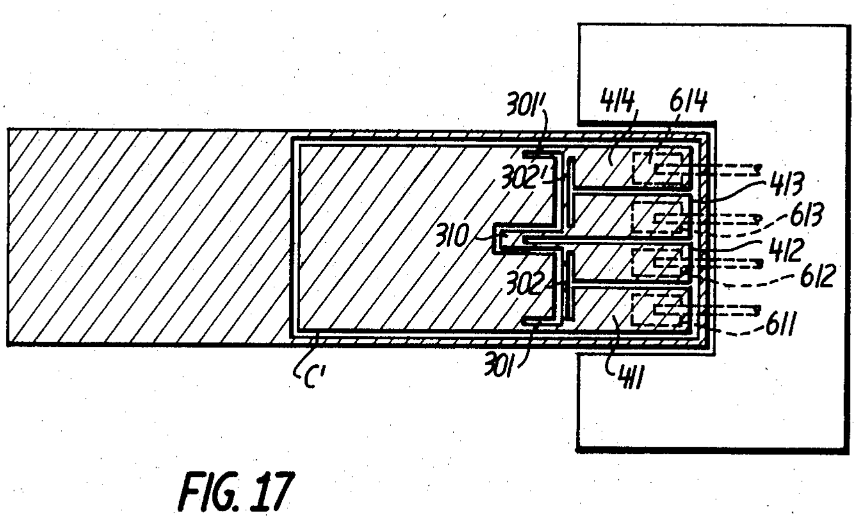
FIG. 17 is a plan view of a semiconductor cantilever type element produced according to the present invention.

Each of the examples of the present invention described above further shows the method for producing a semiconductor diaphragm to be attached to pressure transducers. However, the present invention is not limited to the foregoing. For example, the strain sensitive element shown in FIG. 17, to be employed in a cantilever type accelerometer or a displacement meter, can be easily produced by the method according to the present invention. In FIG. 17, in the same manner as with respect to the diaphragm shown in FIG. 1, the straight narrow groove C' is formed by removing a part of the semiconductor layer formed on the semiconductor base plate to form the strain sensitive parts 301, 302, 310, 301' and 302', and the signal transmitting parts 411 through 414 connected to the strain sensitive parts, the depth of groove C' being equal to or greater than the thickness of the layer formed on the base. Then, the lead mounting electrodes 611 through 614 are formed on predetermined portions of the signal transmitting parts 411 through 414, respectively. Thus, the semiconductor strain sensitive element for a cantilever type accelerometer or a displacement meter can be easily obtained.

Accordingly, the present invention provides a method for producing a semiconductor strain sensitive element of electromechanical semiconductor transducers, which element includes strain sensitive parts and signal transmitting parts formed by providing a narrow groove C at predetermined portions of a semiconductor crystal layer of said element, said lead mounting electrodes formed on predetermined portions of the signal transmitting parts of said element, the electrical signal of said strain sensitive parts being transmitted to said electrodes through said signal transmitting parts.

In the first step of the method according to the present invention, a uniform, thin layer of a semiconductor crystal of an opposite conductivity type to that of the base of a semiconductor crystal having a predetermined conductivity type is formed on the entirety of at least one of the faces of the base to electrically insulate the layer from the base by the P-N junction formed therebetween. Alternatively, a uniform, thin layer of a semiconductor crystal having the same conductivity as that of the base and in which the concentration of an active impurity is much higher than that in the base is formed on the entirety of at least one face of the base to substantially, electrically insulate the layer from the base by the difference in the resistivities therebetween.

In the second step of the method according to the present invention, at least two elongated strain sensitive strip parts whose length is much greater than their width are formed at desired portions within a strain sensitive region of the semiconductor thin layer formed on the base plate by the first step, by removing first predetermined portions of the semiconductor crystal layer and thereby providing first narrow grooves in spaced, parallel relation to one another whose depth is equal to or greater than the thickness of the semiconductor crystal layer. Concurrently with the formation of the at least two strain sensitive parts, a plurality of signal transmitting wide parts whose area is much larger than that of the strain sensitive parts, are formed at the semiconductor thin layer by removing second predetermined portions of the semiconductor thin layer and thereby providing second narrow grooves which are connected to at least one of the first narrow grooves, said plurality of signal transmitting parts being electrically insulated from one another by means of the second narrow grooves.

As is apparent from the foregoing description, the strain sensitive parts and a plurality of the signal transmitting parts are integrally formed on the base plate with the same semiconductor crystal layer so as to form a bridge circuit thereon. Also, the strain sensitive parts and a plurality of the signal transmitting parts which consist of the same semiconductor crystal layer are electrically insulated from the base plate.

Accordingly, in the second step, a strain sensitive element of a special pattern is obtained which has the strain sensitive parts and the signal transmitting parts divided by means of narrow grooves. The present invention can perhaps be best characterized by the aforedescribed second step.

In the third step of the method according to the present invention, lead mounting electrodes are formed on predetermined portions of the signal transmitting parts.

The second embodiment of the method according to the present invention further comprises a fourth step of providing an electrical insulating film on the entire surfaces of the first and second narrow grooves and of the semiconductor crystal layers, except for predetermined portions reserved for forming the lead mounting electrodes.

The third embodiment of the method according to the present invention further comprises a fourth step of filling the first and second narrow grooves formed by the second step with an electrical insulating filler such as an epoxy resin or the like.

Accordingly, in the method of the present invention, the desired strain sensitive element such as a diaphragm, cantilever or the like may be easily produced by only a few straightforward steps. The method according to the present invention does not require complex labor nor sophisticated techniques required in the prior art mask diffusion method, thus, it can attain a high productivity and is therefore also suitable for mass production.

Obviously, numerous modifications and variations of the present invention are possible in light of the above teachings. It is therefore to be understood that within the scope of the appended claims the invention may be practiced otherwise than as specifically described herein.

We claim:

1. A method for producing a semiconductor strain sensitive element for electromechanical semiconductor transducers, said element having a base plate, at least two strain sensitive parts, lead mounting electrodes formed integrally on one face of said base plate, and a plurality of signal transmitting parts for transmitting electrical signals generated by said strain sensitive parts to said lead mounting electrodes, said method comprising the steps of:

forming a layer of a semiconductor crystal integrally with one face of said base plate having electrical insulating characteristics therebetween, said base plate comprising a semiconductor crystal;

forming at least two pairs of first narrow grooves in parallel to one another having a distance therebetween which is short when compared with the length thereof by removing said layer at first predetermined portions within a strain sensitive region, whereby at least two of said strain sensitive parts are formed;

forming a plurality of second narrow grooves comprising a perimeter groove formed at the perimeter part of said element and other grooves connected to said first narrow grooves and said perimeter groove to block a predetermined area by removing said layer at second predetermined portions, whereby a plurality of said signal transmitting parts are formed with a distance therebetween greater than the distance between said first grooves and which encompass an area therein greater than the area between said first grooves; and forming a layer of a metal at a predetermined portion of each of said signal transmitting parts having a predetermined area to connect ohmically with said semiconductor crystal layer of said signal transmitting parts, whereby said lead mounting electrodes are formed and are connected ohmically with said signal transmitting parts.

2. The method for producing a semiconductor strain sensitive element for electromechanical semiconductor transducers according to claim 1, wherein said semiconductor crystal layer comprises a semiconductor crystal of the opposite conductivity type to that of said base plate.

3. The method for producing a semiconductor strain sensitive element for electromechanical semiconductor transducers according to claim 1, wherein said semiconductor crystal layer comprises a semiconductor crystal having the same conductivity type as that of said base plate, the resistivity of said crystal layer being less than 0.001 of that of said base plate.

4. The method for producing a semiconductor strain sensitive element for electromechanical semiconductor transducers according to claim 1, further comprising the step of forming an electrical insulating film on the entire surface of said first and second narrow grooves and of said semiconductor crystal layer except for predetermined portions of said crystal layer upon which are formed said lead mounting electrodes, whereby said semiconductor strain sensitive element becomes covered with an electrical insulating film.

5. The method for producing a semiconductor strain sensitive element for electromechanical semiconductor transducers according to claim 1, further comprising the step of filling said first and second narrow grooves with an electrical insulating filler for reinforcing said semiconductor strain sensitive element.

6. The method for producing a semiconductor strain sensitive element for electromechanical semiconductor transducers according to claim 4, further comprising the step of filling said first and second narrow grooves with an electrical insulating filler for reinforcing said semiconductor strain sensitive element.

7. The method for producing a semiconductor strain sensitive element of electromechanical semiconductor transducers according to claim 1, wherein said semiconductor crystal utilized in said base plate and said layer comprises silicon.

8. The method for producing a semiconductor strain sensitive element for electromechanical semiconductor transducers according to claim 1, wherein said semiconductor crystal utilized in said base plate and said layer comprises germanium.

9. The method for producing a semiconductor strain sensitive element for electromechanical semiconductor transducers according to claim 1, wherein said semiconductor crystal utilized in said base plate and said layer comprises gallium arsenide.

10. The method for producing a semiconductor strain sensitive element for electromechanical semiconductor transducers according to claim 1, wherein said semiconductor crystal layer is formed on the entire surface of at least one of the faces of said base plate by an epitaxial growth method.

11. The method for producing a semiconductor strain sensitive element for electromechanical semiconductor transducers according to claim 1, wherein said semiconductor crystal layer is formed on the entire surface of at least one of the faces of said base plate by a diffusion method.

12. The method for producing a semiconductor strain sensitive element for electromechanical semiconductor transducers according to claim 1, wherein said semiconductor crystal layer is formed on the entire surface of at least one of the faces of said base plate by an ion implantation method.

13. The method for producing a semiconductor strain sensitive element for electromechanical semiconductor transducers according to claim 1, wherein said first and second narrow grooves at said first and second predetermined portions in said layer are formed by a photoetching method.

14. The method for producing a semiconductor strain sensitive element for electromechanical semiconductor transducers according to claim 1, wherein said step of forming said first and second narrow grooves at said first and second predetermined portions in said layer is performed by employing a laser beam or an electron beam.

15. The method for producing a semiconductor strain sensitive element for electromechanical semiconductor transducers according to claim 4, wherein said step of forming said electrical insulating film comprises a thermal oxidation method.

16. The method for producing a semiconductor strain sensitive element for electromechanical semiconductor transducers according to claim 4, wherein said step of forming said electrical insulating film by a vacuum evaporation method.

17. The method for producing a semiconductor strain sensitive element of electromechanical semiconductor transducers according to claim 2, wherein:

said semiconductor crystal utilized in said base plate and said layer comprises silicon;

said silicon crystal layer is formed on said base plate by an epitaxial growth method;

said first and second narrow grooves are formed in approximately straight lines at said first and second predetermined portions in said layer by a photoetching method; and further comprising the step of forming an electrical insulating film on the entire surfaces of said first and second narrow grooves and of said semiconductor crystal layer, except for predetermined portions of said layer utilized for forming said lead mounting electrodes, by a vacuum evaporation method, whereby said semiconductor strain sensitive element becomes covered with said electrical insulating film.

18. The method for producing a semiconductor strain sensitive element for electromechanical semiconductor transducers according to claim 17, wherein said step of forming a layer of a semiconductor crystal comprises the steps of:

a. slicing a block comprising an N-type silicon single crystal to obtain a wafer of the (110) crystallographic plane;

b. processing the surface of said wafer into a mirror finish by lapping and polishing said wafer and then washing the surface thereof with pure water and then drying the same; and c. heating said N-type silicon base in a gas mixture comprising hydrogen ($H_2$), silicon tetrachloride ($SiCl_4$) and diborane ($B_2H_6$) at a temperature of about 1200°C for 1 to 10 minutes to thereby epitaxially grow a thin layer of uniform thickness (about 1$\mu$) comprising P-type silicon on the entire surface of one of said faces of said N-type silicon base; and wherein said step of forming grooves comprises the steps of:

d. coating a photo-resist on the entire surface of said P-type silicon layer;

placing a photomask having predetermined transparent parts and opaque parts over said photo-resist;

developing said photo-resist by exposure to ultraviolet rays from the upper side of the photomask for 10 to 30 seconds;

removing the portion of said photo-resist corresponding to said straight narrow grooves from said P-type silicon layer, the longitudinal direction of said straight narrow grooves being parallel to the [110] direction of said layer;

etching said P-type silicon layer and a part of said N-type silicon base, where said photo-resist was removed, to the depth of the desired groove (about 2$\mu$) with an etching solution comprising $HNO_3$—HF; and removing the remainder of said photo-resist from said semiconductor layer with a dense sulfuric acid and then washing and drying said wafer;

to thereby form said straight narrow grooves which are concave in cross section and extend over the surface of said semiconductor layer, and said strain sensitive parts, signal transmitting parts and perimeter part which are divided by means of said straight narrow grooves; and wherein said step of forming a layer of metal comprises the steps of:

e. forming aluminum evaporated films on said predetermined portions of said signal transmitting parts by a vacuum evaporation method employing a metallic mask having four openings which determines said predetermined portions; and heating said strain sensitive element provided with said evaporated films in nitrogen gas at a temperature of 450°C to 550°C for 10 to 20 minutes;

to thereby form said lead mounting electrodes on said predetermined portions of said signal transmitting parts.

19. The method for producing a semiconductor strain sensitive element for electromechanical semiconductor transducers according to claim 3, wherein:

said semiconductor crystal utilized in said base plate and said layer comprises silicon;

said silicon crystal layer is formed on said base plate by an epitaxial growth method;

said first and second narrow grooves are formed in approximately straight lines at said first and second predetermined portions in said layer by a photo-etching method; and further comprising the step of forming an electrical insulating film on the entire surfaces of said first and second narrow grooves and of said semiconductor crystal layer, except for predetermined portions of said layer utilized for forming said lead mounting electrodes, by a vacuum evaporation method, whereby said semiconductor strain sensitive element becomes with the said covered electrical insulating film.

20. The method for producing a semiconductor strain sensitive element for electromechanical semiconductor transducers according to claim 19, wherein said step of forming a layer of a semiconductor crystal comprises the steps of:

a. slicing a block comprising an N-type silicon single crystal to obtain a wafer of the (110) crystallographic plane;

b. processing the surface of said wafer into a mirror finish by lapping and polishing said wafer and then by washing the surface thereof with pure water and then drying the same;

c. epitaxially growing a thin layer of uniform thickness (about $1\mu$) of $N^+$-type silicon on the entire surface of one face of said N-type silicon base by heating said N-type silicon base at a temperature of about 1200°C for 1 to 10 minutes in a gas mixture comprising hydrogen ($H_2$), silicon tetrachloride ($SiCl_4$) and phosphine ($PH_3$), the resistivity of said epitaxial layer being about 0.0002 of that of said base; and wherein said step of forming grooves comprises the steps of:

d. coating a photo-resist on the entire $N^+$-type silicon layer;

placing a photomask having a predetermined transparent parts and opaque parts over said photo-resist;

developing said photo-resist by exposure to ultraviolet rays from the upper side of said photomask for 10 to 30 seconds;

removing the portion of said photo-resist corresponding to said straight narrow grooves from said $N^+$-type silicon layer, the longitudinal direction of said straight narrow grooves being parallel to the [100] direction of said layer;

etching said $N^+$-type silicon layer and a part of said N-type silicon base, where said photo-resist was removed, to the depth of the desired groove (about $2\mu$) with an etching solution comprising $HNO_3$—HF; and removing the remainder of said photo-resist from said semiconductor layer with a dense sulfuric acid and then washing and drying said wafer;

to thereby form said straight narrow grooves which are concave in cross section and extend over the surface of said semiconductor layer and to form said strain sensitive parts, signal transmitting parts and perimeter part which are divided by means of said straight narrow grooves, and wherein said step of forming a layer of metal comprises the steps of:

e. forming aluminum evaporated films on said predetermined portions of said signal transmitting parts by a vacuum evaporation method employing a metallic mask having four openings corresponding to said predetermined portions; and heating said strain sensitive element provided with said evaporated films in nitrogen gas at a temperature of 450°C to 550°C for 10 to 20 minutes;

to thereby form said lead mounting electrodes on said predetermined portions of said signal transmitting parts.

21. The method for producing a semiconductor strain sensitive element for electromechanical semiconductor transducers according to claim 4, wherein said semiconductor crystal utilized in said base plate and said layer comprises silicon.

22. The method for producing a semiconductor strain sensitive element for electromechanical semiconductor transducers according to claim 21, wherein said silicon crystal layer comprises a semiconductor crystal having the opposite conductivity type to that of said base.

23. The method for producing a semiconductor strain sensitive element for electromechanical semiconductor transducers according to claim 22, wherein said semiconductor crystal layer is formed on the entire surface of at least one of the faces of said base plate by a diffusion method.

24. The method for producing a semiconductor strain sensitive element for electromechanical semiconductor transducers according to claim 23, wherein said first and second narrow grooves are formed in approximately straight lines at said first and second predetermined portions in said layer by a photo-etching method.

25. The method for producing a semiconductor strain sensitive element for electromechanical semiconductor transducers according to claim 24, wherein said electrical insulating film is formed by a thermal oxidation method.

26. The method for producing a semiconductor strain sensitive element for electromechanical semiconductor transducers according to claim 25, which includes the following steps:

a. slicing a block comprising an N-type silicon single crystal to obtain a wafer of the (110) crystallographic plane;

b. processing the surface of said wafer into a mirror finish by lapping and polishing said wafer and then by washing the surface thereof with pure water and then drying the same;

c. heating said N-type silicon base at a temperature of 1000°C to 1200°C in a gas mixture comprising oxygen ($O_2$), nitrogen ($N_2$) and diborane ($B_2H_6$) for 20 to 60 minutes to uniformly diffuse boron on the entire surface of both faces of said base to thereby form a thin diffused layer of uniform thickness (about $1\mu$) of P-type silicon;

d. coating a photo-resist on the entire P-type silicon layer;
placing a photomask having predetermined transparent parts and opaque parts over said photo-resist;

developing said photo-resist by exposure to ultraviolet rays from the upper side of said photomask for 10 to 30 seconds;
removing the portion of said photo-resist corresponding to said straight narrow grooves from said P-type silicon layer;
etching said P-type silicon layer and a part of said N-type silicon base, where said photo-resist was removed, to the depth of the desired groove (about 2$\mu$) with an etching solution comprising $HNO_3$—HF;
removing the remainder of said photo-resist from said semiconductor layer with a dense sulfuric acid, and then washing and drying said wafer to thereby form said straight narrow grooves which are concave in cross section and extend over the surface of said semiconductor layer and to form said strain sensitive parts, signal transmitting parts and perimeter part which are divided by means of said straight narrow grooves;
de1. heating said semiconductor strain sensitive element at a temperature of approximately 1000°C for approximately 30 minutes in a saturated vapor steam in order to form a silicon oxide film (the thickness thereof being approximately several thousand A) on the entire surfaces of said layer and said straight narrow grooves;
de2. removing predetermined portions of said silicon oxide film corresponding to lead mounting electrodes to be formed hereafter by a selective etching method employing a photo-resist;
e. forming aluminum evaporated films on said predetermined portions where said silicon oxide film was removed, by a vacuum evaporation method employing a metallic mask having four openings corresponding to said predetermined portions; and
heating said strain sensitive element provided with said evaporated films in nitrogen gas at a temperature of 450°C to 550°C for 10 to 20 minutes to thereby form said lead mounting electrodes on said predetermined portions of said signal transmitting parts.

27. The method for producing a semiconductor strain sensitive element for electromechanical semiconductor transducers according to claim 5, wherein;

said semiconductor crystal utilized in said base plate and said layer comprises silicon;
said semiconductor crystal layer comprises a semiconductor crystal of the opposite conductivity type to that of said base;
said silicon crystal layer is formed on said base plate by an epitaxial growth method;
said first and second narrow grooves are formed in approximately straight lines at predetermined portions in said layer by a photo-etching method; and said electrical insulating filler comprises an epoxy resin.

28. The method for producing a semiconductor strain sensitive element for electromechanical semiconductor transducers according to claim 27, which includes the following steps:
a. slicing a block comprising an N-type silicon single crystal to obtain a wafer of the (110) crystallographic plane;
b. processing the surface of said wafer into a mirror finish by lapping and polishing said wafer and then washing the surface thereof with pure water and then drying the same;
c. heating the N-type silicon base in a gas mixture comprising hydrogen ($H_2$), silicon tetrachloride ($SiCl_4$) and diborane ($B_2H_6$) at a temperature of approximately 1200°C for 1 to 10 minutes to thereby epitaxially grow a thin layer of uniform thickness (about 1$\mu$) comprising P-type silicon on the entire surface of one of the faces of said N-type silicon base;
d. coating a photo-resist on the entire P-type silicon layer;
placing a photomask having predetermined transparent parts and opaque parts over said photo-resist;

developing said photo-resist by exposure to ultraviolet rays from the upper side of said photomask for 10 to 30 seconds;
removing the portion of said photo-resist corresponding to said straight narrow grooves from said P-type silicon layer;
etching said P-type silicon layer and a part of said N-type silicon base where said photo-resist was removed, to the depth of the desired groove (about 2$\mu$) with an etching solution comprising $HNO_3$—HF;
removing the remainder of said photo-resist from said semiconductor layer with a dense sulfuric acid and then washing and drying the entire wafer to thereby form said straight narrow grooves which are
concave in cross section and extend over the surface of said semiconductor layer, and to form said strain sensitive parts, signal transmitting parts and perimeter part which are divided by means of said straight narrow grooves;
e. forming aluminum evaporated films on said predetermined portions of said signal transmitting parts by a vacuum evaporation method employing a metallic mask having four openings corresponding to said predetermined portions;
heating said strain sensitive element provided with said evaporated films in nitrogen gas at a temperature of 450°C to 550°C for 10 to 20 minutes to thereby form said lead mounting electrodes on said predetermined portions of said signal transmitting parts,
f. providing an adhesive such as an epoxy resin on said P-type silicon layer of said semiconductor strain sensitive element; and
forcing said adhesive into said narrow grooves by spinning said element at a speed of a few hundred rpm to thereby fill said narrow grooves with said adhesive.

* * * * *